US008848752B2

United States Patent
Prather et al.

(10) Patent No.: US 8,848,752 B2
(45) Date of Patent: Sep. 30, 2014

(54) HIGH SPECTRAL-PURITY CARRIER WAVE GENERATION BY NONLINEAR OPTICAL MIXING

(75) Inventors: Dennis W. Prather, Newark, DE (US); Garrett Schneider, New Castle, DE (US); Janusz Murakowski, Bear, DE (US)

(73) Assignee: Phase Sensitive Innovations, Inc., Newark, DE (US)

(*) Notice: Subject to any disclaimer, the term of this patent is extended or adjusted under 35 U.S.C. 154(b) by 0 days.

(21) Appl. No.: 13/979,792

(22) PCT Filed: Jan. 18, 2012

(86) PCT No.: PCT/US2012/021634
§ 371 (c)(1),
(2), (4) Date: Jul. 15, 2013

(87) PCT Pub. No.: WO2012/099914
PCT Pub. Date: Jul. 26, 2012

(65) Prior Publication Data
US 2013/0301664 A1 Nov. 14, 2013

Related U.S. Application Data

(60) Provisional application No. 61/433,554, filed on Jan. 18, 2011.

(51) Int. Cl.
*H01S 3/10* (2006.01)
*H01S 3/109* (2006.01)
(Continued)

(52) U.S. Cl.
CPC ............... *H01S 3/109* (2013.01); *G02F 2/004* (2013.01); *G02F 1/03* (2013.01);
(Continued)

(58) Field of Classification Search
CPC ....... H01S 3/00; H01S 3/0014; H01S 3/0078; H01S 3/0085; H01S 3/08027; H01S 3/10053; H01S 3/10084; H01S 3/2383; H01S 3/2391
USPC ............................. 372/26, 28, 29.02, 29.023
See application file for complete search history.

(56) References Cited

U.S. PATENT DOCUMENTS

2003/0090767 A1* 5/2003 Yap et al. ....................... 359/181
2004/0051936 A1 3/2004 Watson et al.
(Continued)

OTHER PUBLICATIONS

International Search Report issued in PCT/US2012/021634, mail date Apr. 19, 2012.
(Continued)

*Primary Examiner* — Dung Nguyen
(74) *Attorney, Agent, or Firm* — Panitch Schwarze Belisario & Nadel LLP

(57) ABSTRACT

Signal generating systems and methods are described. One signal generation system includes first and second lasers configured to generate first and second laser beams having respective frequencies wherein a difference in the respective frequencies corresponds to an output frequency, a photodetector configured to produce a signal at the output frequency, and first and second electro-optic modulators configured to respectively electro-optically modulate the first and second laser beams using the signal to produce respective first and second modulated optical signals, each of the first and second modulated optical signals having a respective sideband corresponding to the frequency of the other one of the first and second laser beams. The first laser is seeded with the respective sideband of the second modulated optical signal and the second laser is seeded with the respective sideband of the first modulated optical signal to phase-lock the first and second laser beams to each other.

25 Claims, 6 Drawing Sheets

(51) Int. Cl.
*G02F 2/00* (2006.01)
*H01S 5/40* (2006.01)
*H01S 5/0687* (2006.01)
*G02F 1/03* (2006.01)
*H01S 5/065* (2006.01)
*H01S 5/00* (2006.01)

(52) U.S. Cl.
CPC ............... *G02F 2/002* (2013.01); *H01S 5/0656* (2013.01); *H01S 5/0078* (2013.01); *G02F 2203/13* (2013.01); *H01S 5/0085* (2013.01); *H01S 5/4087* (2013.01); *G02F 2002/008* (2013.01); *H01S 5/0687* (2013.01)
USPC ....... 372/28; 372/26; 372/29.02; 372/29.023; 372/32

(56) References Cited

U.S. PATENT DOCUMENTS

2005/0259997 A1   11/2005   Sternklar et al.
2007/0076776 A1*   4/2007   Lust et al. ....................... 372/56
2010/0135342 A1    6/2010   Livas et al.
2011/0255094 A1*  10/2011   Mohageg et al. ............. 356/461

OTHER PUBLICATIONS

International Preliminary Report on Patentability and Written Opinion issued in PCT/US2012/021634 issued Jul. 23, 2013.

* cited by examiner

US 8,848,752 B2

HIGH SPECTRAL-PURITY CARRIER WAVE GENERATION BY NONLINEAR OPTICAL MIXING

CROSS-REFERENCE TO RELATED APPLICATIONS

This Application is a U.S. National Stage of PCT International Application No. PCT/US2012/021634, filed on Jan. 18, 2012, and claims priority to U.S. Provisional Application No. 61/433,554, filed on Jan. 18, 2011. The disclosures of the aforementioned applications are incorporated herein in their entirety by reference.

FIELD OF THE INVENTION

The present invention relates in general to a carrier wave generation system and, more specifically, to carrier waves generated using nonlinear optical phenomena to achieve high spectral-purity signals.

BACKGROUND OF THE INVENTION

Optical generation of radio frequency (RF), millimeter-wave (mmW), and Terahertz (THz) frequency signals often involves mixing two optical beams having frequencies separated by a desired frequency. The mixing may be performed with a nonlinear device such as a high-speed photodetector (PD). Although simply mixing output beams of two lasers operating independently on a photodiode produces high frequency signals, the frequency and phase stability are limited by the stability of the individual lasers. If two independent lasers are used, the line-width of the resulting signal may be difficult to reduce below 1 MHz when using DFB lasers. Such spectral purity may be inadequate for many applications because applications often require a narrow line-width and a stable phase of emitted electromagnetic radiation. To reduce line-width, the laser sources may be phase-locked.

Given that the two lasers operate at different wavelengths, simple laser seeding may not produce a desired frequency separation because the laser seeding would normally produce coherent beams of the same wavelength.

SUMMARY OF THE INVENTION

The present invention is embodied in signal generation systems and methods. In accordance with aspects of the invention, a scheme is applied based on a second order nonlinear phenomena, i.e., the linear electro-optic effect or Pockels effect, in that two lasers are phase-locked together by electro-optic locking mechanism at different frequencies so as to achieve improvement in line-width and phase stability.

According to one aspect of the present invention, a signal generation system includes first and second lasers configured to generate first and second laser beams having respective frequencies wherein a difference in the respective frequencies corresponds to an output frequency, a photodetector (PD) configured to mix the first and second laser beams to produce a signal at the output frequency, and first and second electro-optic modulators (EOMs) configured to respectively electro-optically modulate the first and second laser beams using the signal to produce respective first and second modulated optical signals, each of the first and second modulated optical signals having a respective sideband corresponding to the frequency of the other one of the first and second laser beams. The first laser is seeded with the respective sideband of the second modulated optical signal and the second laser is seeded with the respective sideband of the first modulated optical signal to phase-lock the first and second laser beams to each other.

According to another aspect of the present invention, a signal generation system includes first and second lasers configured to generate first and second laser beams having respective frequencies, wherein a difference in the respective frequencies corresponds to an output frequency, a photodetector configured to mix the first and second laser beams to produce a signal at the output frequency, an electro-optic modulator (EOM) configured to electro-optically modulate the second laser beam using the signal to produce a modulated optical signal, the modulated optical signal having a respective sideband corresponding to the frequency of the first laser beam, and a signal generator configured to drive the EOM with a drive signal that matches the output frequency, or such that the output frequency is an integer multiple of the drive signal frequency. The first laser is seeded with the respective sideband of the modulated optical signal to phase-lock the first laser beam with the second laser beam, and the output frequency is frequency and phase matched to the drive signal.

According to another aspect of the present invention, a method of generating a signal includes generating first and second laser beams having respective frequencies such that a difference in the respective frequencies corresponds to an output frequency, mixing the first and second laser beams to produce a signal at the output frequency, electro-optically modulating each of the first and second laser beams using the signal to produce respective first and second modulated optical signals, each of the first and second modulated optical signals having a respective sideband corresponding to the frequency of the other one of the first and second laser beams; and phase-locking the first and second laser beams to each other using the respective sidebands of the second modulated optical signal and the first modulated optical signal, respectively.

BRIEF DESCRIPTION OF THE DRAWINGS

Exemplary embodiments will be explained in greater detail below with reference to the figures, in which.

DETAILED DESCRIPTION OF THE INVENTION

Figure 1:
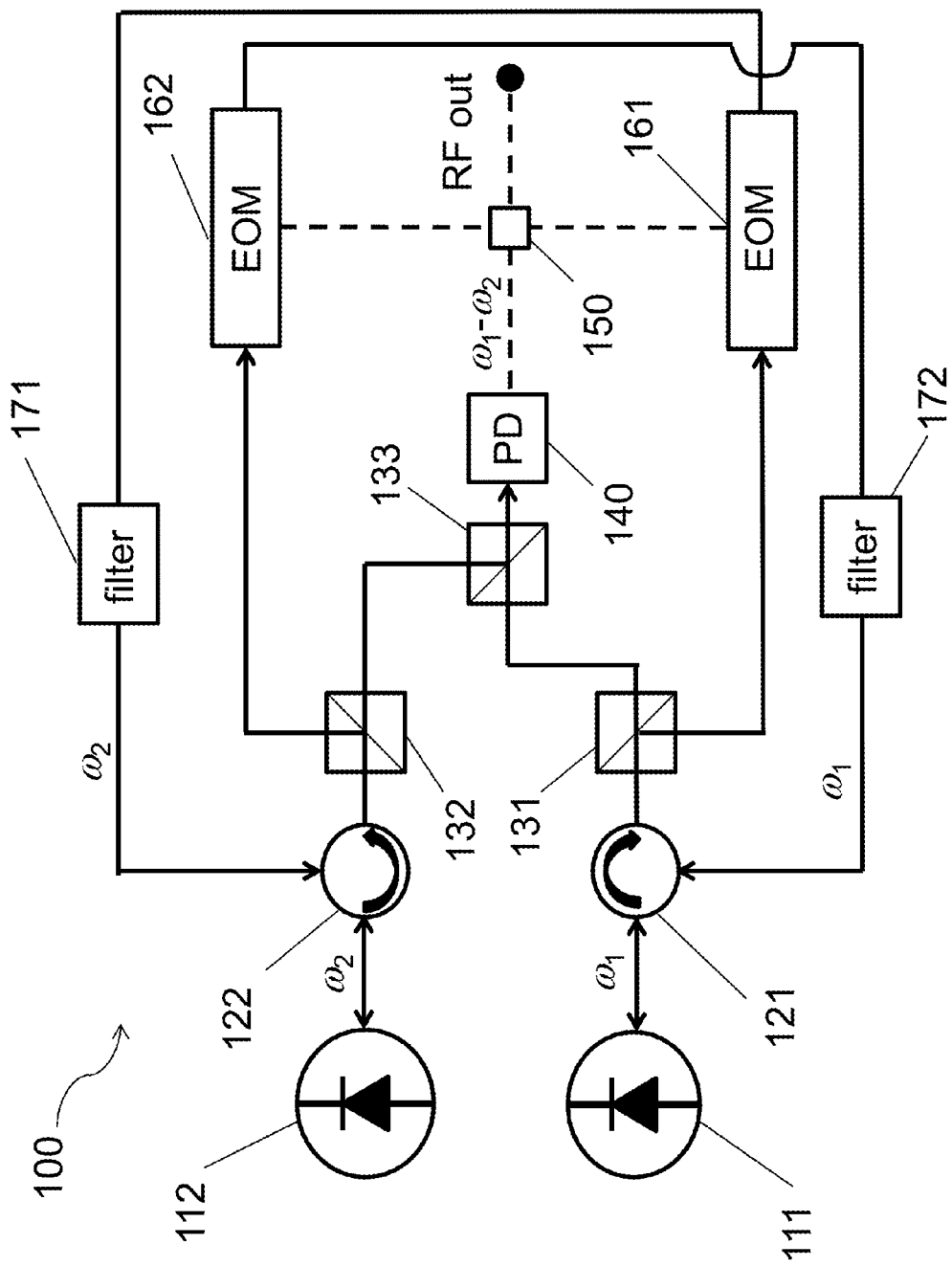
FIG. 1 is a block diagram depicting an exemplary system for generating a signal by nonlinear optical mixing in accordance with an aspect of the present invention.

Hereinafter, the embodiments of the present invention described below relate to a configuration of a signal generation system which uses a scheme based on nonlinear optical mixing to produce phase-locking of at least one of the laser sources. Conventional schemes for narrowing the line-width of individual lasers generally includes locking them to external reference oscillators (e.g., atomic/molecular resonance oscillators). Embodiments of the present invention are different from these schemes in that at least one of the lasers is phase-locked to the other at different frequencies by optical nonlinear phenomena to yield a narrow line-width output signal. Although the invention is described below with reference to the generation of RF signals, it will be understood that the invention can also be used to generate signals including other wavelengths, such as millimeter wave (mmW), and Terahertz (THz).

Embodiments of the present invention utilize the nonlinear effect, i.e., electro-optic effect, to convert the wavelength produced by one laser to the wavelength of the other, and vice versa; the conversion manifests as sidebands produced by phase modulation obtained when a signal is applied to an electro-optic material carrying an optical beam. The converted wavelengths are then used to mutually seed the laser sources. Because the nonlinear effects preserve coherence, the laser sources are thereby phase-locked, or mutually coherent, even though they operate at different wavelengths. The wavelength offset, which is equivalent to frequency difference, allows the generation of the signal with high spectral purity and without using a seed signal.

In accordance with the electro-optic effect, an applied electric field or slow (compared to optical frequencies) RF signal induces a change in the refractive index of a material. The electro-optic effect encompasses a number of distinct phenomena including Pockels effect (linear electro-optic effect) that the change in the refractive index is linearly proportional to the electric field, and Kerr effect (quadratic electro-optic effect) that the change in the refractive index is proportional to the square of the electric field.

In optics, the second order nonlinearity describes the dependence of the refractive index of a dielectric on an externally applied electric field. Such a nonlinearity enables, for example, the modulation of an optical beam by application of a voltage to the material through which the beam propagates. In this context, the second-order nonlinearity is referred to as the Pockels effect. There is also a third-order nonlinearity which is responsible for the dependence of the refractive index on the square of the applied electric field. The third-order nonlinearity is referred to as Kerr effect.

One method of laser locking for RF generation uses four-wave-mixing and an auxiliary laser as the nonlinear mixing medium. In accordance with this method, two DFB lasers emitting at different wavelengths are phase-locked via mutual injection assisted by a Four-Wave-Mixing process that takes place in a third auxiliary DFB. The result demonstrates the generation of a spectrally pure tunable mmW signal without a reference RF signal.

Aspects of the present invention use the second-order nonlinearity (i.e., Pockels effect), as opposed to the third-order nonlinearity (i.e., Kerr effect), to produce phase-locking of the laser sources.

Electro-optic modulators (EOMs) are used in aspects of the present invention to modulate the laser beam in order to phase-lock the lasers. An EOM is an optical device in which a signal-controlled element having a Pockels effect is used to modulate a beam of light. An application of EOMs is for creating sidebands in a monochromatic laser beam. The modulation of a beam of light may result in the original carrier frequency plus two small sidebands separated from the original carrier frequency by the frequency of the input applied voltage. Suitable vendors of the EOMs include Covega Corporation of Jessup, Md. and Phase Sensitive Innovations Inc. (PSI) of Newark, Del.

The present invention utilizes the sideband generated from the modulation of one laser beam to seed another laser. This not only results in a phase-locked operation, but also a dramatic narrowing of the signal spectrum.

Exemplary embodiments of the present invention are described more fully hereinafter with reference to the accompanying drawings. It is to be understood that although the following description mainly provides a carrier wave signal, having considerably narrower line-width and superior phase stability, many alterations and changes can be made by those skilled in the art, without deviating from the scope of the invention. This description is not to be taken in a limiting sense, but is made merely for the purpose of illustrating the general principles of the invention.

FIG. 1 depicts an exemplary signal generating system 100 for generating a signal, such as an RF signal, with high spectral-purity using a nonlinear optical mixing scheme in accordance with one aspect of the present invention.

As a general overview, signal generating system 100 includes first laser 111, second laser 112, photodetector 140, first EOM 161, and second EOM 162. The illustrated signal generating system 100 further includes three-port optical circulators 121, 122, beamsplitters 131, 132, beam combiner 133, splitter 150 and optical filters 171, 172. Signal generating system 100 may use optical fibers to convey the optical beams. Additional details of signal generator 100 are provided below.

First laser 111 generates a first laser beam at a first frequency $\omega_1$. Second laser 112 generates a second laser beam at a second frequency $\omega_2$. The frequency offset ($\omega_1$-$\omega_2$) of the first and second laser beams corresponds to an output frequency ($\omega_1$-$\omega_2$).

In one embodiment, first and second laser 111, 112 may be wavelength-tunable lasers, for example, DFB lasers. In another embodiment, first and second laser 111, 112 may include a dual-frequency laser transmitter with the frequency offset corresponding to the desired output frequency. First and second laser 111, 112 may also be, by way of non-limiting example, dual-mode lasers, pulsed lasers, vertical cavity surface emitting lasers (VCSELs), or other wavelength-tunable lasers, which provide a few mW of optical power with a line-width of ~1 MHz.

In one embodiment, optical circulators 121, 122 are used to route the laser beams generated from first laser 111 and second laser 112. Optical circulators act as signal routers, transmitting light from an input port to an output port, but directing light that returns to a third port. Thus, an optical circulator can be used to separate optical signals that travel in opposite directions in a medium, such as an optical fiber. They perform a similar function as an isolator, protecting the input fiber from return power, but also allowing the returned light to be employed. Suitable optical circulators may have the following characteristics: a signal entering at Port 1 exits only at Port 2; a signal entering at Port 2 exits only at Port 3; a signal entering at Port 3 either exits only at Port 1 or is absorbed at Port 3 depending on applications. The advantages of an optical circulator includes high isolation of the input and reflected optical powers.

In one embodiment, optical circulators 121, 122 are three-port devices that allow light to travel in only one direction. The first laser beam generated from first laser 111 passes through three-port optical circulator 121 and then propagates through beamsplitter 131. Optical circulator 121 is configured to receive the first laser beam from first laser 111 at the first port and to direct the first laser beam out to beamsplitter 131 at the second port. The third port of optical circulator 121 receives a seeding signal and directs the seeding signal to the first port for phase-locking first laser 111, which is described below. Beamsplitter 131 splits the first laser beam into two portions, i.e., a first portion and a second portion. The first portion of the first laser beam is collected at beam combiner 133. The second portion of the first laser beam is sent into first EOM 161.

Similarly, the second laser beam generated from second laser 112 passes through optical circulator 122 and then propagates through beamsplitter 132. Optical circulator 122 is configured to receive the second laser beam from second laser 112 at the first port and direct the second laser beam out to second beamsplitter 132 at the second port. The third port of three-port optical circulator 122 receives a seeding signal and directs the seeding signal to the first port for phase-locking second laser 112, which is described below. Beamsplitter 132 splits the second laser beam into two portions, i.e., a first portion and a second portion. The first portion of the second laser beam is collected at beam combiner 133 and meets with the one portion of the first laser beam therein. The second portion of the second laser beam is sent into second EOM 162.

The first portion of the first laser beam and the first portion of the second laser beam are combined at beam combiner 133 and directed to photodetector 140. The first and second laser beams are combined, mixed by photodetector 140. Photodetector 140 may be any existing and emerging high-speed photodetectors. In one embodiment, photodetector 140 may be a high-speed photodetector, such as, a high-speed photodiode, on which the first and second laser beams are nonlinearly mixed. In an alternative embodiment, photodetector 140 may be a high-speed traveling wave detector. As such, optical heterodyning of the first and second laser beams takes place at photodetector 140 resulting in the RF signal frequency. The optical heterodyning is based on the interference of first and second laser beams occurred on photodetector 140. The beat frequency of the RF signal is equal to the frequency difference between the two laser beams. It is known that the RF signal is correlated to the frequencies and phases of the first and second laser beams. Thus, it is desirable to maintain a well-defined relationship between the frequency and the phase of the two laser beams. If two independent lasers are used for the light sources, it may be difficult to reduce the line-width of the resulting RF signal below 1 MHz. Such spectral purity may be inadequate for some applications. In order to reduce the RF line-width further, as provided below, phase-locking of the laser sources using the Pockels effect is implemented.

The output of photodetector 140 is split three ways by splitter 150. Splitter 150 is connected to the output of photodetector 140. Splitter 150 receives the RF signal from photodetector 140 and split it into three portions, i.e., a first portion, a second portion and a third portion. The first portion of the RF signal is directed into first EOM 161 to modulate the first laser beam received therein. The second portion of the RF signal is directed into second EOM 162 to modulate the second laser beam received therein. The third portion is output as the generated RF output signal.

Figures 2A, 2B:
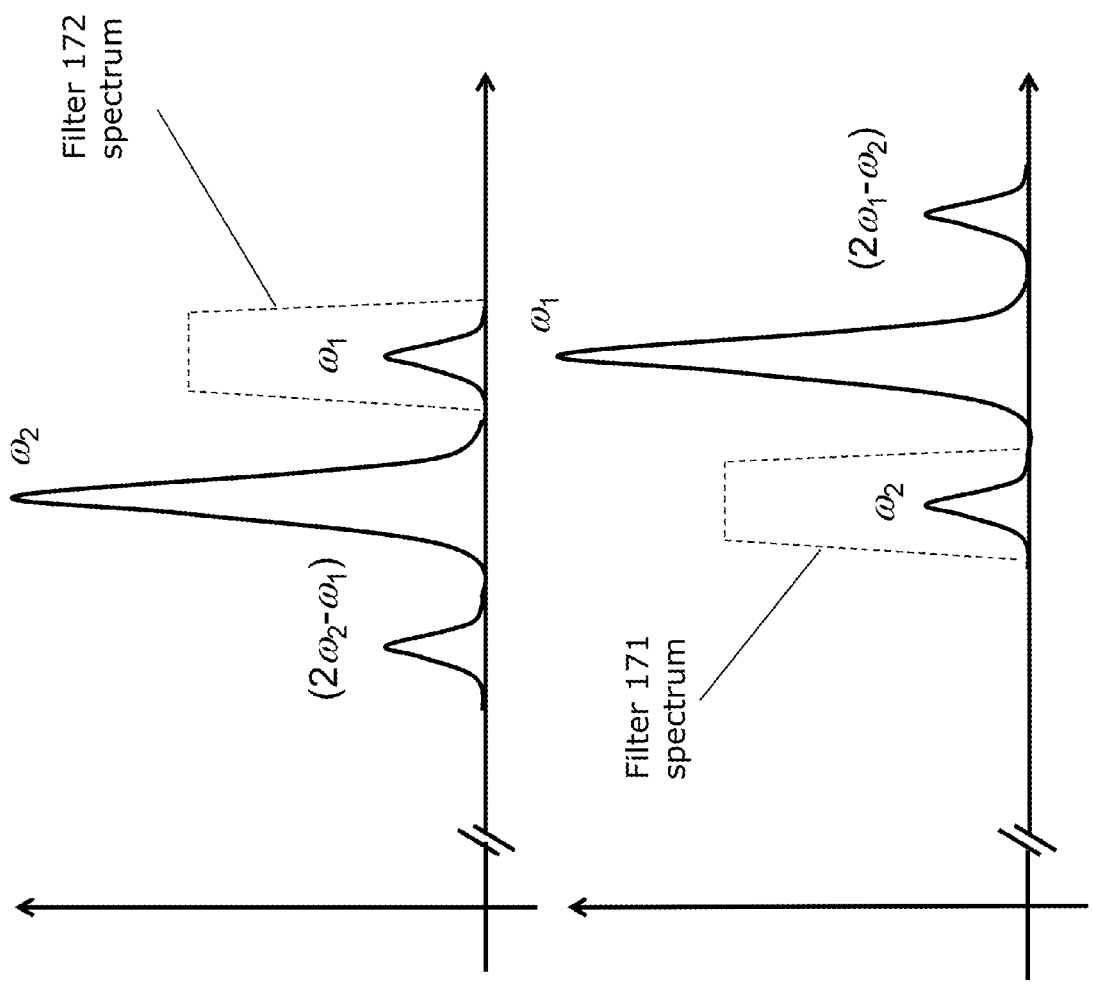
FIG. 2A is a graph of a first modulated optical signal with sidebands in accordance with an aspect of the present invention.
FIG. 2B is a graph of a second modulated optical signal with sidebands in accordance with an aspect of the present invention.

First EOM 161 receives the second portion of the first laser beam split by beamsplitter 131 and the first portion of the RF signal split by splitter 150. The first portion of the RF signal modulates the first laser beam in EOM 161 to produce a first modulated optical signal having sidebands. The sidebands contain power as a result of the modulation process. The sidebands consist of all the Fourier components of the modulated signal except the carrier. As such, the modulation of the first laser beam by first EOM 161 induces sidebands separated from the carrier frequency ($\omega_1$) of the first laser beam by the frequency of the RF signal ($\omega_1$-$\omega_2$), as shown in FIG. 2B. FIG. 2B shows that the first modulated optical signal includes two sidebands induced by first EOM 161. The two sidebands are separated from the carrier frequency ($\omega_1$) by the frequency of the RF signal ($\omega_1$-$\omega_2$) and centered at $\omega_2$ and $2\omega_1$-$\omega_2$, respectively.

Similarly, second EOM 162 receives the second portion of the second laser beam split by beamsplitter 132 and the second portion of the RF signal split by splitter 150. The second portion of the RF signal modulates the second laser beam in EOM 162 to produce a second modulated optical signal having sidebands. The sidebands contain power as a result of the modulation process. The sidebands consist of all the Fourier components of the modulated signal except the carrier. As such, the modulation of the second laser beam by second EOM 162 is the same as that of the first laser beam modulated by first EOM 161 and induces sidebands separated from the carrier frequency ($\omega_2$) of the second laser beam by the frequency of the RF signal ($\omega_1$-$\omega_2$), as shown in FIG. 2A. FIG. 2A shows that the second modulated optical signal includes two sidebands induced by second EOM 162. The two sidebands are separated from the carrier frequency ($\omega_2$) by the frequency of the RF signal ($\omega_1$-$\omega_2$) and centered at $2\omega_2$-$\omega_1$ and $\omega_1$, respectively.

Optical filters 171, 172 may be passband filters in which the desired wave band is allowed to pass and the unwanted wave band is blocked. In one embodiment, the optical filter 171, 172 may be optical dense wavelength division multiplexing (DWDM) filters.

A first optical filter 171 selects one of the sidebands induced by first EOM 161. In one embodiment, first optical filter 171 selects the sideband from the first modulated optical signal that corresponds to the carrier frequency ($\omega_2$) of the second laser beam. The selected sideband ($\omega_2$) by first optical filter 171 is then sent into the third port of second three-port optical circulator 122 as the seeding for second laser 112 to seed second laser 112.

Similarly, a second optical filter 172 selects one of the sidebands induced by second EOM 162. In one embodiment, second optical filter 172 selects the sideband from the second modulated optical signal that corresponds to the carrier frequency ($\omega_1$) of the first laser beam. The selected sideband ($\omega_1$) by second optical filter 172 is then sent into the third port of first three-port optical circulator 121 as the seeding for first laser 111 to seed first laser 111.

As such, the sideband generated from the modulation of each laser seeds the other laser. This results in a phase-locked operation of the two lasers, which dramatically narrows the RF spectrum. Thus, by phase-locking the lasers' emission from one to another using an electro-optic locking mechanism, as described in this invention, considerably narrower line-width and superior phase stability of the signal can be achieved.

Signal generating system 100 enables widely tunable mmW and RF sources. The tuning of the system may be realized by shifting the wavelength of one or both of the lasers (in opposite directions) because the frequency of the generated RF signal is equal to the difference between the frequencies at which the two lasers operate. A small change in the operating wavelength of one of the lasers produces a large change in the generated output frequency. As an example, commercial telecommunication DFB lasers can be readily temperature-tuned over a wavelength range of a few nanometers, enabling the generation of RF signals exceeding 1 THz.

Signal generating system 100 also enables modulation without an RF seed signal. The modulation of the first and second laser beams from first and second lasers 111, 112 is carried through to the modulation of the RF signal generated with RF signal generating system 100. Thus, in the present invention, an RF seed signal is not required.

Additionally, signal generating system 100 enables optical distribution of an RF wave. It is known that high-frequency RF waveguides are notorious for their high losses. In contrast, optical fibers are known for their low-loss operation and light weight as compared to waveguides. By sending a pair of optical beams in a fiber in place of a high-frequency RF signal in a waveguide, the signal can be delivered over a long distance. Also, since the signal bandwidth of the optical beam is a small fraction of the carrier frequency, the dispersion is negligible as compared to the dispersion in RF waveguides.

The advantages of the present invention include providing widely tunable RF sources; being able to provide optical distribution of RF wave; and carrying out the electro-optic modulation free of RF seed signal; ultra-wide band tuning capabilities, while enjoying low-SWaP (size, weight, and power); and dispersion-free functionality of RF photonics.

In one embodiment, first and second lasers 111, 112 can additionally be modulated by a signal generated from a signal generator, and the modulation is carried over to the modulation of the RF carrier. Furthermore, it illustrates the ability to impart information on the RF via optical modulation.

Figure 3:
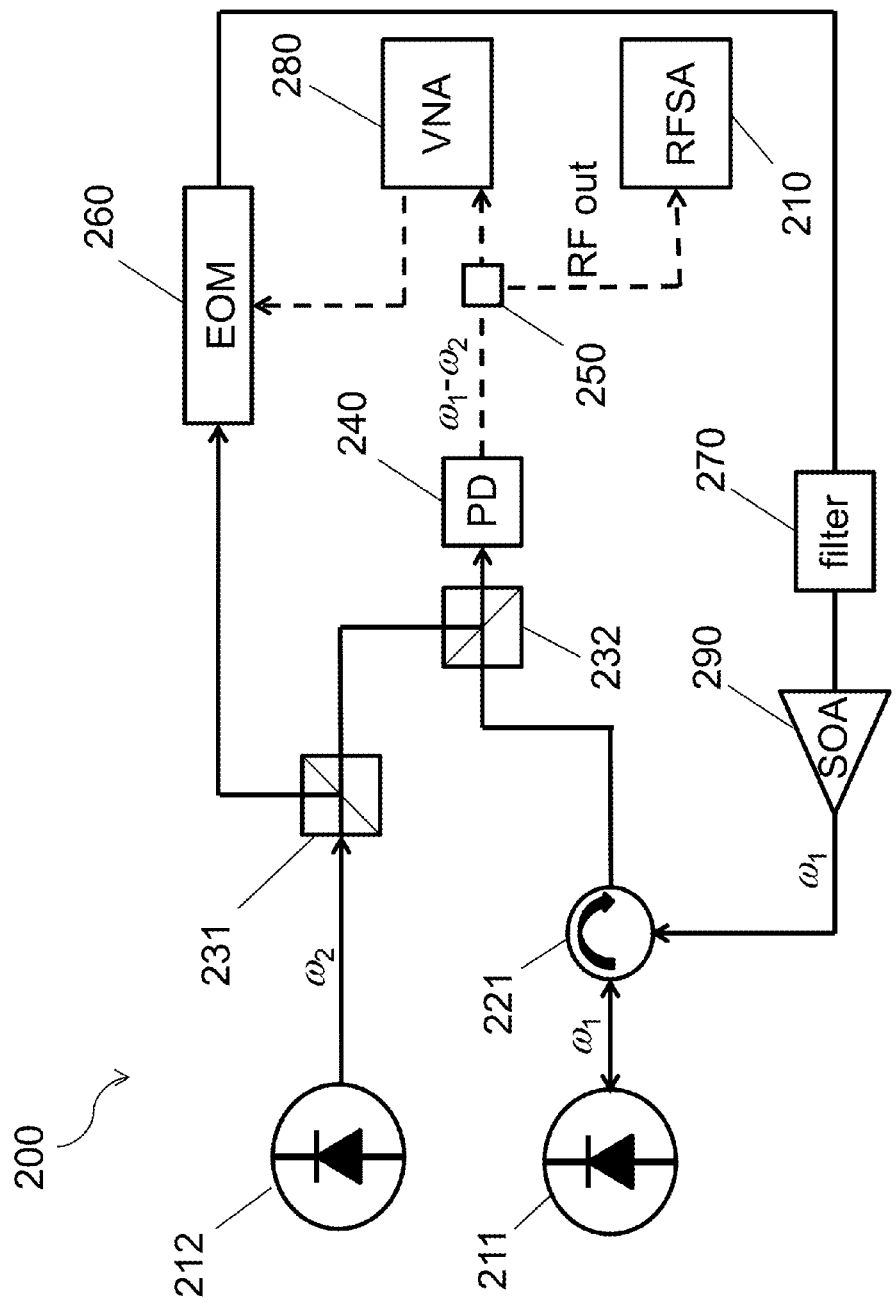
FIG. 3 is a block diagram depicting an alternative exemplary system for generating a signal by nonlinear optical mixing in accordance with an aspect of the present invention.

FIG. 3 depicts an alternative exemplary signal generating system 200 for generating a signal such as, an RF signal, with high spectral-purity using a nonlinear optical mixing scheme in accordance with one aspect of the present invention. In this embodiment, one of the lasers may additionally be modulated by a seed signal, and the modulation may be carried over to the modulation of the RF carrier.

Signal generating system 200 demonstrates that the line-width of the RF signal narrows down to about 1 Hz or better (from an original several MHz of unlocked lasers) by utilizing electro-optic locking mechanism. To achieve this high stability, an external reference may be used. Such references are readily available at lower frequency (e.g., typically about 10 MHz).

As a general overview, signal generating system 200 includes, as shown in FIG. 3, first laser 211, second laser 212, photodetector 240, EOM 260, and signal generator 280. Signal generating system 200 further includes three-port optical circulator 221, beamsplitter 231, beam combiner 232, splitter 250, optical passband filter 270 and semiconductor optical amplifier (SOA) 290. RF signal generating system 200 may use optical fibers to convey the optical beams. Additional details of signal generator 200 are provided below.

Signal generating system 200 is based on the concept of signal generating system 100 shown in FIG. 1, which generates the RF signal with high spectral-purity using nonlinear optical mixing scheme. The difference between signal generating system 200 and signal generating system 100 is that there is only one EOM 260 and one associated feedback path in signal generating system 200. That is, first laser 211 is phase-locked to second laser 212, but second laser 212 is not seeded with a locking sideband from first laser 211. Rather, the sideband-generating signal of second laser 212 that drives EOM 260 comes from signal generator 280.

Signal generator 280 may be any existing and emerging signal generator that provides a drive signal that matches the RF frequency to drive EOM 260. In one embodiment, signal generator 280 may be a VNA (hereinafter referred to as "VNA 280") that monitors the output signal and determines when a phase-locking has been established.

Herein, VNA 280 is configured to drive EOM 260 with a continuous waveform (CW) tone that matches the frequency difference ($\omega_1$-$\omega_2$) between first and second lasers 211, 212, and monitors the output of photodetector 240. In one embodiment, the frequency difference ($\omega_1$-$\omega_2$) may be a harmonic signal that is an integer multiple of the CW tone produced by signal generator 280. If the frequency of VNA 280 is $\omega$, where $\omega$ is equal to the frequency difference ($\omega_1$-$\omega_2$), the modulation with this VNA frequency $\omega$ of the first laser beam generated from first laser 211 operating at frequency $\omega_1$ produces, in addition to the sidebands at $\omega_1$+$\omega$ and $\omega_1$-$\omega$, also sidebands at $\omega_1$+$2\omega$, $\omega_1$-$2\omega$, $\omega_1$+$3\omega$, $\omega_1$-$3\omega$, etc. The additional sidebands are due to nonlinearity of the modulator transfer function (not to be confused with the nonlinearity of the material that EOM is made of). The higher the amplitude of the modulating signal, the more pronounced the manifestation of the nonlinearity of the modulator transfer function in the presence of the higher harmonics in the sidebands. As it turns out, the EOM 260 can be driven hard enough so that the higher-harmonic sidebands are sufficiently strong to enable injection phase-locking of second laser 212. The EOM 260 may be successfully phase-locked to the 10-th or even 12-th harmonic. This enables phase-locking the laser at an offset frequency that is a multiple of the original frequency $\omega$ of VNA 280. This ability to lock to the harmonic offset enables to use of a lower frequency high fidelity signal (generated electronically) to produce a high frequency signal with the high fidelity of the low frequency signal preserved. It will be understood by one of skill in the art from the description herein that the technique described herein using harmonic signal(s) may be used with other embodiments such as the embodiments described above with reference to FIG. 1.

VNA 280 also indicates when the mixing signal of first and second lasers 211, 212 is frequency and phase matched to the drive signal of VNA 280, for example, by a large jump (>30 dB) in the forward transmission coefficient (i.e., $S_{21}$) measurement.

Another advantage of VNA 280 is that the RF output power of VNA 280 is greater than what can be attained from photodetector 240 used in signal generation system 100. However, even with the greater RF power (+4 dBm) provided to EOM 260 by VNA 280, the optical sideband power used to seed first laser 211 may be insufficient to induce phase-locking without further amplification.

In one embodiment, SOA 290 indicated in FIG. 3 between optical filter 270 and optical circulator 221 is provided to amplify the sideband power selected by optical filter 270. SOA 290 may increase the sideband power by 15 dB, which is sufficient to induce phase-locking of first laser 211 to second laser 212 and VNA 280.

Figure 4:
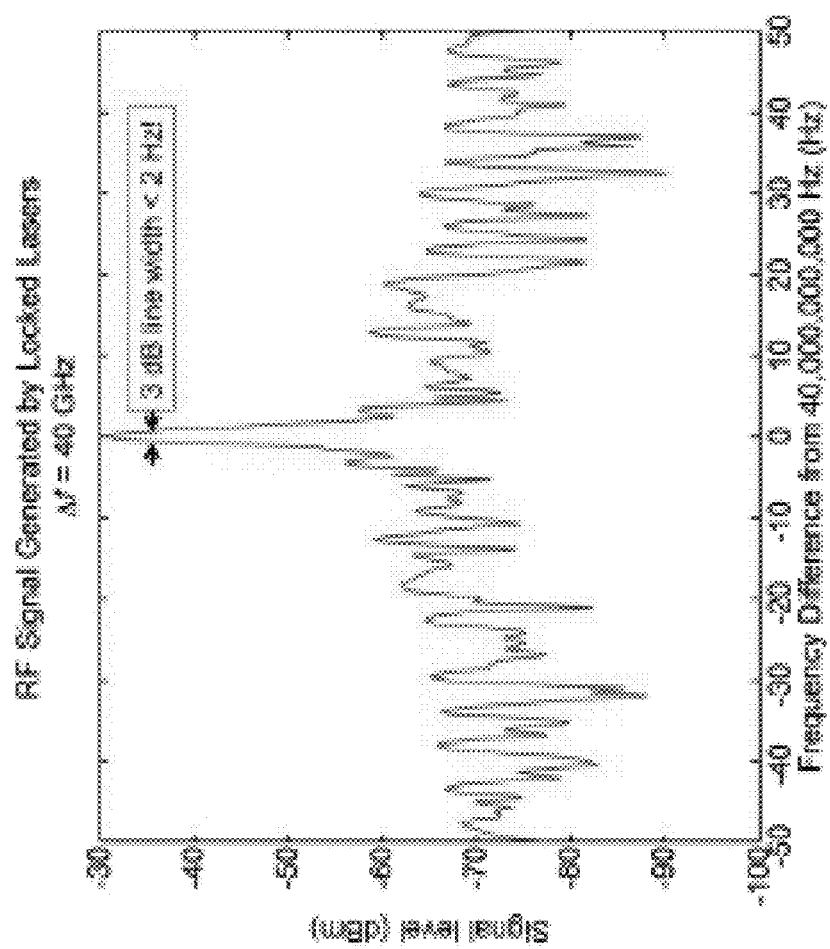
FIG. 4 is a graph of spectrum analyzer trace measurement of the output signal generated at 40 GHz when the output signal generator is phase locked in accordance with the system depicted in FIG. 3.

When phase-locking of first laser 211 to second laser 212 and VNA 280 has been achieved, the results of the RF signal measured by a RF Spectrum Analyzer (RFSA) 210 are dramatic; for example, the line-width of the mixing tone (i.e. the RF signal) decreases from ~1-2 MHz to less than 2 Hz. RFSA 210 allows the output signal to be directly measured and characterized. FIG. 4 depicts a measurement of the mixing tone generated at 40 GHz when the system is phase-locked. Because the minimum resolution bandwidth of RFSA 210 is 1 Hz, a line-width smaller than 2 Hz could not be observed. This means that the line-width of the RF signal produced by the embodiments of the present invention may not be limited to 2 Hz and may have a great potential to be below 2 Hz.

When first and second lasers 211, 212 are thermally tuned in Signal generation system 200, and the output frequency of VNA 280 adjusted accordingly, similar results were obtained to produce output frequencies below 10 GHz. Such frequencies are too low for optical DWDM filters to effectively separate the carrier frequency from the sideband after EOM 260, therefore, in this case, in one embodiment, no filter is used. Since second laser 212 is thermally tuned to oscillate at the sideband frequency, the injected sideband is still able to induce phase-locking.

Figure 5:
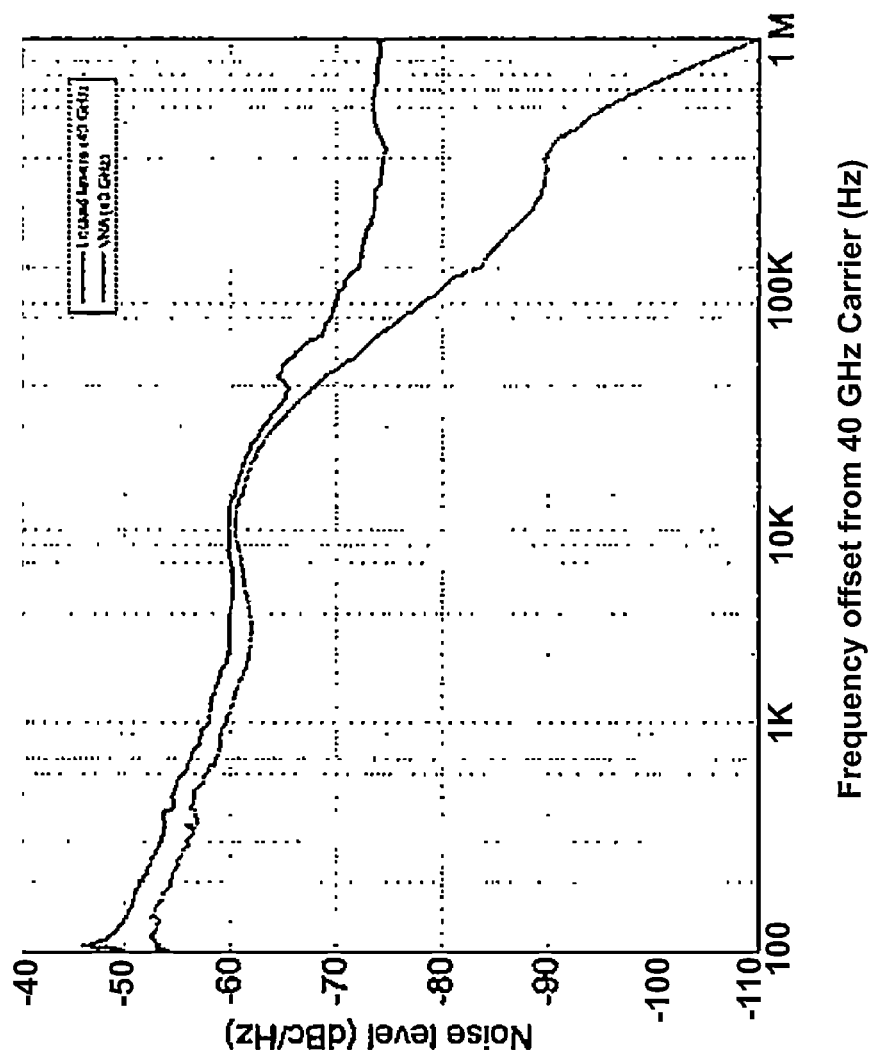
FIG. 5 is a graph of a phase noise comparison of phase-locked laser mixing and Vector Network Analyzer (VNA) modulator drive signal at 40 GHz in accordance with the system depicted in FIG. 3.

It should be noted that because there is no seeding of second laser 212 in signal generating system 200, any narrowing of the output of second laser 212 should not be expected, rather it is assumed that the line-width of second laser 212 remains a few MHz. The narrow output signal line-width, however, can still be obtained because when phase-locked, the output spectrum of second laser 212 is identical to that of first laser 211, which is only shifted by the drive frequency of VNA 280. Further, the frequency fluctuations of first and second lasers 211, 212 are phase-locked, i.e. their outputs are perfectly correlated in time, so that even as their individual line-widths remain a few MHz, their difference is constant, which is limited only by the stability of VNA 280 (which has likewise been measured to be ~1-2 Hz). FIG. 5 shows that the phase noise spectrum of the generated output signal is similar to that of VNA 280 itself for offsets less than ~30 kHz, indicating that very little additional phase noise is produced by first and second lasers 211, 212.

Figure 6:
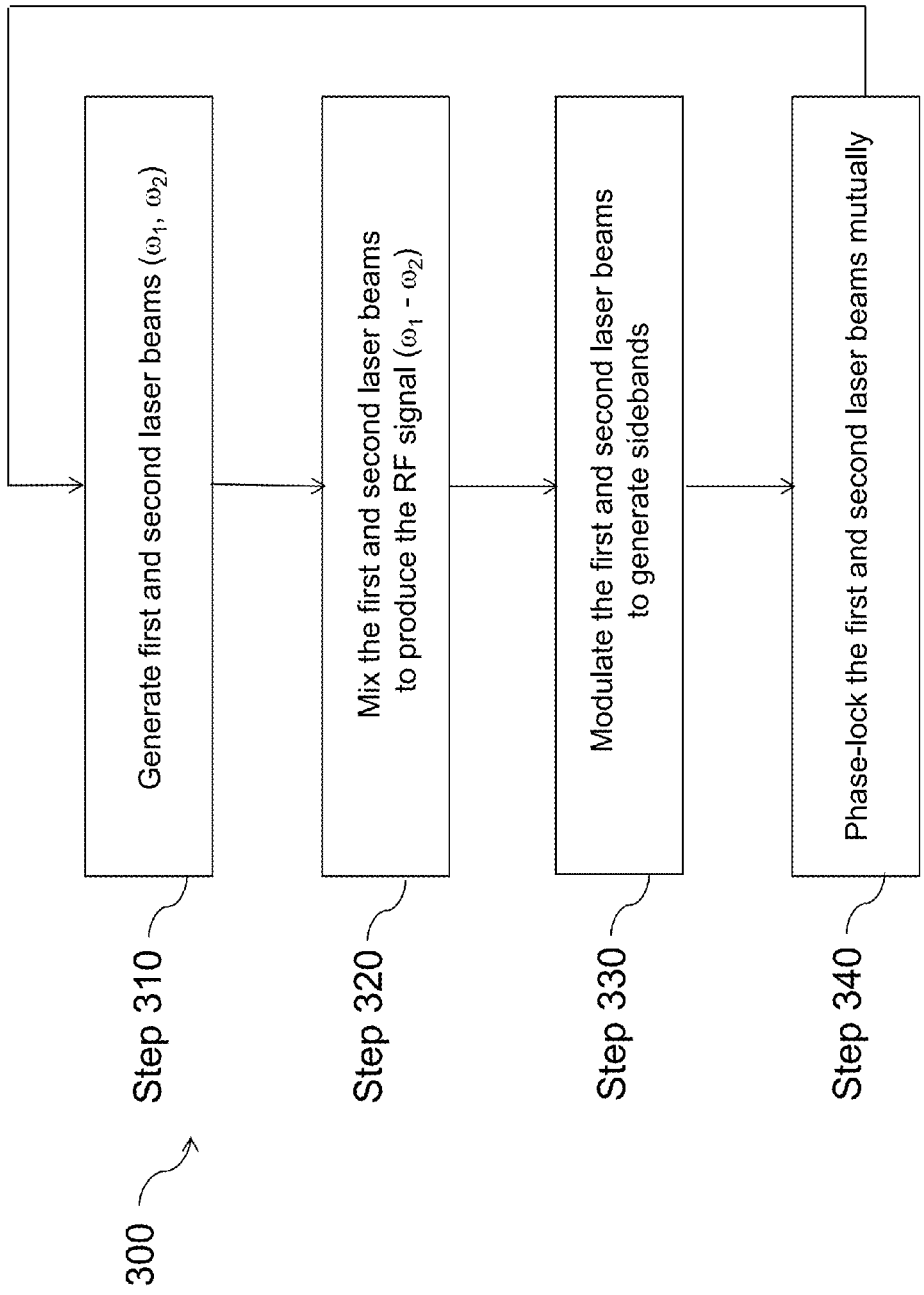
FIG. 6 is a flow chart of exemplary steps for generating a signal with high spectral-purity in accordance with an aspect of the present invention.

FIG. 6 is a flow chart 300 depicting exemplary steps for generating a RF signal in accordance with one aspect of the present invention. To facilitate description, the steps of FIG. 6 are described with reference to the system components of FIG. 1. It will be understood by one of skill in the art from the description herein that one or more steps may be omitted and/or different components may be utilized without departing from the spirit and scope of the present invention.

In step 310, the first and second laser beams are generated with first and second lasers 111, 112. The first and second laser beams have respective frequencies $\omega_1$ and $\omega_2$. The difference in the frequencies of the first and second laser beams corresponds to an RF frequency ($\omega_1$-$\omega_2$). In one embodiment, first and second laser 111, 112 may be wavelength-tunable lasers, for example, DFB lasers. In another embodiment, first and second laser 111, 112 may be provided with a dual-frequency laser transmitter with the frequency offset corresponding to the desired RF frequency. First and second laser 111, 112 may also be dual-mode lasers, pulsed lasers, optical frequency shifters, single side band modulators, and any existing and emerging wavelength-tunable lasers.

In step 320, the first and second laser beams are mixed at photodetector 140 producing the output signal at a frequency equal to the difference in the frequencies of the first and second laser beams. In one embodiment, the first and second laser beams pass through three-port optical circulators 121, 122 and then propagates through beamsplitters 131, 132, respectively. Beamsplitter 131, 132 split the first and second laser beams into two respective portions. The first portion of each laser beam is combined at beam combiner 133 and then mixed on photodetector 140. The second portion of each laser beam is directed into a respective EOM 161 or 162. Optical heterodyning of the first and second laser beams takes place at photodetector 140 resulting in the output signal frequency ($\omega_1$-$\omega_2$). The beat frequency ($\omega_1$-$\omega_2$) of the output signal is equal to the difference between the frequencies ($\omega_1$, $\omega_2$) of the two laser beams.

In step 330, the first and second laser beams are electro-optically modulated by the output signal to produce respective first and second modulated optical signals. In one embodiment, the second portion of each laser beam split by the respective beamsplitter 131 or 132 is sent into the respective EOMs 161, 162. The modulation of each laser beam introduces sidebands separated from the carrier frequency ($\omega_1$, or $\omega_2$) by the frequency of the output signal ($\omega_1$-$\omega_2$). Each of the first and second modulated optical signals has a sideband ($\omega_1$, or $\omega_2$) corresponding to the frequency of the other one of the first and second laser beams. The sideband equal to the frequency of the other one of the first and second laser beams is selected by an optical filter, for example, a DWDM filter, and sent back to the corresponding optical circulator to seed the complementary laser.

In step 340, the two lasers are phase-locked to each other at their respective frequencies. In one embodiment, the selected sideband from the modulation of each laser is used to seed the other laser such that first and second lasers 111 and 112 are phase-locked to each other at the respective frequencies. This results in a phase-locked operation of the two lasers which narrows the line-width of the output signal.

The method of generating the output signal may further include a step of shifting the frequency of one of the first and second laser beams to adjust the output frequency. In the present invention, a small relative change in the respective frequencies of the first and second laser beams produces a large change in the output frequency. For example, if the lasers operate at wavelengths near 1550 nm (C band), a wavelength change of 0.8 nm, ~0.05% of the operating wavelength, produces a change in output frequency of 100 GHz.

The embodiments disclosed in the present invention demonstrate that frequency-shifted sidebands obtained by electro-optic modulation can be used to injection lock lasers at frequency differences that can be tuned over a wide range. Presently, the upper limit for the generated output signal is limited by the speed of available photodetectors. Recent advances in high-speed traveling wave detectors indicate that this technique may be effective at generating frequencies exceeding 200 GHz.

With improved modulator conversion efficiency, and more efficient photodetectors, it will be possible to use the output signal itself to drive the EOM(s) that are used to create the injection sidebands. In such case it will not be necessary to have a signal source already at the frequency being generated (like the VNA in the present invention); rather, one can stabilize one laser using a single, lower frequency master oscillator, via a similar injection technique and a separate modulator, then lock the lasers to each other as has been disclosed.

Possible uses of the present invention include the generation of high-frequency, widely-tunable RF waves, or mmW, THz and m-IR waves. Such a wave may serve as a carrier for a data-carrying signal that may be imparted optically on the wave carrier, as described above. The ultimate use of such waves include, for example, communication, detection, sensing and chemical (spectral) analysis, etc.

Although the invention is illustrated and described herein with references to specific embodiments, the invention is not intended to be limited to the details shown. Rather, various modifications may be made in the details within the scope and range of equivalents of the claims and without departing from the invention.

What is claimed is:

1. A signal generating system comprising:
   first and second lasers configured to generate first and second laser beams having respective frequencies wherein a difference in the respective frequencies corresponds to an output frequency;
   a photodetector configured to mix the first and second laser beams to produce a signal at the output frequency; and
   first and second electro-optic modulators (EOMs) configured to respectively electro-optically modulate the first and second laser beams using the signal to produce respective first and second modulated optical signals, each of the first and second modulated optical signals having a respective sideband corresponding to the frequency of the other one of the first and second laser beams, wherein the first laser is seeded with the respective sideband of the second modulated optical signal and the second laser is seeded with the respective sideband of the first modulated optical signal to phase-lock the first and second laser beams to each other.

2. The signal generating system of claim 1, further comprising a signal generator configured to drive the first or second EOM or both EOMs with a drive signal that matches the output frequency, wherein the driving signal is a harmonic signal that is an integer multiple of a continuous waveform (CW) tone produced by the signal generator, the signal generator modulates the first or second laser beam or both using the harmonic signal to produce a modulated signal, and the modulated signal has sidebands corresponding to the frequency of the first or second laser beam plus and minus the harmonic signal, such that the output frequency is frequency and phase matched to an offset of the harmonic signal.

3. The signal generating system of claim 1, further comprising a splitter connected to the output of the photodetector, the splitter configured to split the output signal into three portions, two of the three portions routed to the first and second EOMs, respectively, to modulate the first and second laser beams, and the third portion the generated signal.

4. The signal generating system of claim 1, further comprising first and second beam splitters configured to split the first and second laser beams into two portions, respectively.

5. The signal generating system of claim 4, further comprising first and second optical circulators, the first optical circulator configured to receive the first laser beam from the first laser, to direct the first laser beam to the first beamsplitter, and to route the respective sideband of the second modulated optical signal back to the first laser, the second optical circulator configured to receive the second laser beam from the second laser, to direct the second laser beam to the second beamsplitter, and to route the respective sideband of the first modulated optical signal back to the second laser.

6. The signal generating system of claim 5, further comprising a beam combiner, the beam combiner configured to combine the two portions of the first and second laser beams on the photodetector.

7. The signal generating system of claim 1, further comprising passband filters, each passband filter configured to select the respective sideband of the first and second modulated optical signals corresponding to the respective frequencies of the first and second laser beams.

8. The signal generating system of claim 7, wherein each of the passband filters is an optical dense wavelength division multiplexing (DWDM) filter.

9. The signal generating system of claim 8, further comprising semiconductor optical amplifiers (SOAs), each SOA configured to amplify the respective sideband of the first and second modulated optical signals selected by the respective passband filter.

10. The signal generating system of claim 1, further comprising optical fibers, wherein the first and second laser beams and the first and second modulated optical signals are conveyed by the optical fibers.

11. The signal generating system of claim 1, wherein the first and second lasers are wavelength-tunable lasers and wherein a wavelength range of a few nanometers change in the respective frequencies of the first and second laser beams results in the output frequency exceeding 1 THz.

12. The RF signal generating system of claim 11, wherein each of the wavelength-tunable lasers is a distributed feedback (DFB) laser.

13. A signal generation system comprising:

first and second lasers configured to generate first and second laser beams having respective frequencies, wherein a difference in the respective frequencies corresponds to an output frequency;

a photodetector configured to mix the first and second laser beams to produce a signal at the output frequency;

an electro-optic modulator (EOM) configured to electro-optically modulate the second laser beam using the signal to produce a modulated optical signal, the modulated optical signal having a respective sideband corresponding to the frequency of the first laser beam; and a signal generator configured to drive the EOM with a drive signal that matches the output frequency, wherein the first laser is seeded with the respective sideband of the modulated optical signal to phase-lock the first laser beam with the second laser beam, and the output frequency is frequency and phase matched to the drive signal.

14. The signal generating system of claim 13, further comprising a splitter connected to the output of the photodetector, the splitter configured to split the output signal into two portions, one of the two portions routed to the EOM to modulate the first laser beam and another portion being the generated signal.

15. The signal generating system of claim 13, further comprising a beam splitter configured to split the first laser beam into two portions.

16. The signal generating system of claim 15, further comprising a beam combiner configured to combine one portion of the first laser beam split by the beamsplitter and the second laser beam.

17. The signal generating system of claim 16, further comprising an optical circulator, the optical circulator configured to receive the second laser beam from the second laser, to direct the first laser beam to the beam combiner, and to route the respective sideband of the modulated optical signal back to the first laser.

18. The signal generator of claim 13, further comprising a passband filter, the passband filter configured to select the respective sideband of the modulated optical signal corresponding to the frequency of the second laser beam.

19. The signal generating system of claim 18, wherein the passband filter is an optical dense wavelength division multiplexing (DWDM) filter.

20. The signal generator of claim 19, further comprising a semiconductor optical amplifier (SOA) following the passband filter, the SOA configure to amplify the selected sideband of the modulated optical signal.

21. The signal generating system of claim 13, wherein the first and second lasers are wavelength-tunable lasers and wherein a wavelength range of a few nanometers change in the respective frequencies of the first and second laser beams results in the output frequency exceeding 1 THz.

22. The signal generating system of claim 13, wherein the driving signal is a harmonic signal that is an integer multiple of a continuous waveform (CW) tone produced by the signal generator, the signal generator modulates the second laser beam using the harmonic signal to produce a modulated signal, and the modulated signal has sidebands corresponding to the frequency of the second laser beam plus and minus the harmonic signal, such that the output frequency is frequency and phase matched to an offset of the harmonic signal.

23. A method of generating a signal comprising:
generating first and second laser beams having respective frequencies such that a difference in the respective frequencies corresponds to an output frequency;
mixing the first and second laser beams to produce a signal at the output frequency;
electro-optically modulating each of the first and second laser beams using the signal to produce respective first and second modulated optical signals, each of the first and second modulated optical signals having a respective sideband corresponding to the frequency of the other one of the first and second laser beams; and
phase-locking the first and second laser beams to each other using the respective sidebands of the second modulated optical signal and the first modulated optical signal, respectively.

24. The method according to claim 23, further comprising shifting the respective frequency of at least one of the first and second laser beams to adjust the output frequency.

25. The method according to claim 23, further comprising driving the respective first or second modulated optical signal or both with a drive signal generated from a signal generator and matching the output frequency,
wherein the drive signal is a harmonic signal that is an integer multiple of a continuous waveform (CW) tone produced by the signal generator, the signal generator modulates the first or second laser beam or both using the harmonic signal to produce a modulated signal, and the modulated signal has sidebands corresponding to the frequency of the first or second laser beam plus and minus the harmonic signal, such that the output frequency is frequency and phase matched to an offset of the harmonic signal.

* * * * *